(12) United States Patent
Kim

(10) Patent No.: US 8,027,204 B2
(45) Date of Patent: Sep. 27, 2011

(54) FLAG SIGNAL GENERATION CIRCUIT AND SEMICONDUCTOR MEMORY DEVICE

(75) Inventor: Keun Kook Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 452 days.

(21) Appl. No.: 12/317,975

(22) Filed: Dec. 30, 2008

(65) Prior Publication Data

US 2010/0085816 A1 Apr. 8, 2010

(30) Foreign Application Priority Data

Oct. 2, 2008 (KR) ........................ 10-2008-0097385

(51) Int. Cl.
*G11C 7/10* (2006.01)

(52) U.S. Cl. .......... 365/189.05; 365/189.09; 365/189.11

(58) Field of Classification Search ............. 365/189.05, 365/189.09, 189.11
See application file for complete search history.

(56) References Cited

U.S. PATENT DOCUMENTS 6,058,066 A * 5/2000 Norris et al. ............. 365/230.05
6,700,810 B1 * 3/2004 Ichiriu et al. ............... 365/49.18

FOREIGN PATENT DOCUMENTS

KR       10-0904741 B1    6/2009
KR       10-2009-0085056 A    8/2009

* cited by examiner

*Primary Examiner* — Tuan T. Nguyen
(74) *Attorney, Agent, or Firm* — John P. White; Cooper & Dunham LLP

(57) ABSTRACT

There is provided a flag signal generation circuit. The flag signal generation circuit includes a status register read (SRR) signal generating unit receiving an idle signal and an SRR command to generate an SRR signal; a pulse signal generating unit receiving an SRR signal to generate a pulse signal; and a flag signal generating unit receiving the pulse signal and a read signal for SRR to generate a flag signal.

19 Claims, 4 Drawing Sheets ic memory device. More particularly, the present invention relates to a flag signal generation circuit which generates a flag signal at which a normal active operation is performed to be suitable for specification for SRR.

BACKGROUND

Status information of a semiconductor memory device includes device identification (DI) information, revision identification (RI) information, refresh rate (RR) information, device width (DW) information, device type (DT) information and density (DS) information. The DI information is fixed information as information for identifying a manufacturer, and the RI information is variable information as information for defining a revision performance version. The RR information is variable information as information on refresh performance timing, and the DW information is variable information as information for defining the number of data bits outputted in accordance with an address input. The DT information is fixed information as information on capacity of the semiconductor memory device, and the DS information is fixed information on an integration degree of the semiconductor memory device.

Such status information of a semiconductor memory device is stored in a register. A user can identify the status information of the semiconductor memory device stored in the register through status register read (SRR).

The SRR is specified in JEDEC SPEC as follows: i) The SRR is started after a power-up period is ended. ii) A read command for the SRR is inputted in an idle state after application of MRS. iii) BL is fixed to 2 during SRR operation. iv) tSRR=2 CLK, tSRC=CL+1. v) The SRR is ended when a bank active command is inputted. An operation timing diagram of the SRR specified in the JEDEC SPEC is shown with reference to FIG. 1.

In the JEDEC SPEC specified as described above, the conditions ii) and v) will be more specifically described. Before the read command for the SRR is inputted, the semiconductor memory device should be in an idle state. Therefore, when the bank active command is inputted before the read command for the SRR is inputted, the SRR is not normally performed but ended.

Since a general read operation of a semiconductor memory device is performed after bank activation, there have been increased requests for SRR which is, like the read operation, not ended but can be normally performed even though a read command for SRR is inputted after the bank active command for the bank active is inputted. However, in a semiconductor memory device according to the JEDEC SPEC, such requests cannot be satisfied.

SUMMARY

Embodiments of the present invention are directed to providing a flag signal generation circuit and a semiconductor memory device, wherein an external active command inputted before an input of a read operation for SRR is neglected, and a normal active operation is performed when an external command is inputted after the input of the read operation for SRR.

In one embodiment, a flag signal generation circuit comprises an SRR signal generating unit receiving an idle signal and an SRR command to generate an SRR signal; a pulse signal generating unit receiving an SRR signal to generate a pulse signal; and a flag signal generating unit receiving the pulse signal and a read signal for SRR to generate a flag signal.

In another embodiment, a semiconductor memory device comprises a flag signal generation circuit generating a flag signal enabled until a read signal for SRR is inputted after SRR is started; and an active signal generating unit receiving the flag signal and an external active signal to generate an internal active signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE PREFERRED EMBODIMENTS

Hereinafter, an exemplary embodiment of the present invention will be described with reference to accompanying drawings. The embodiment is for illustrative purposes only, and the scope of the present invention is not limited thereto.

Figure 1:
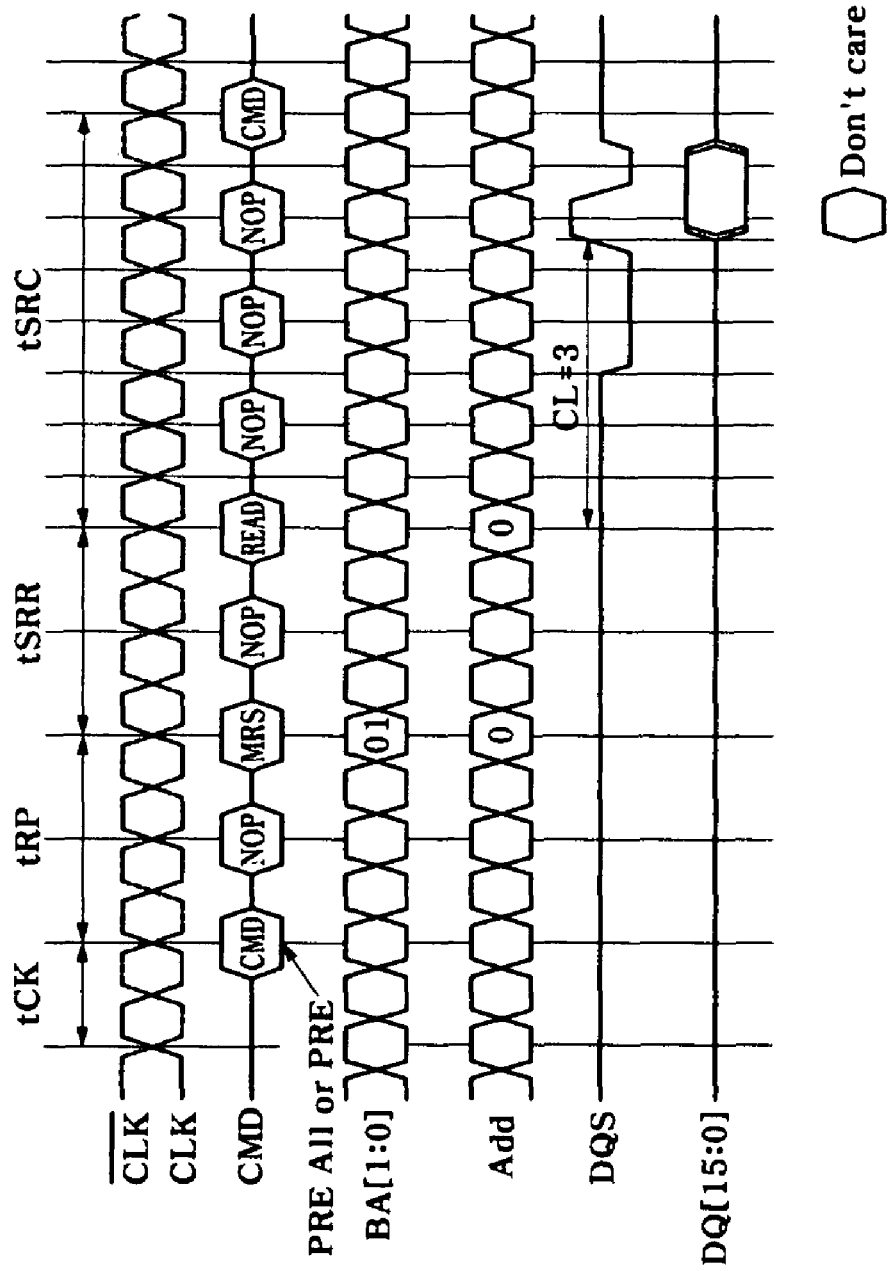
FIG. 1 is a timing diagram illustrating the operation of SRR specified by JEDEC SPEC.
Figure 2:
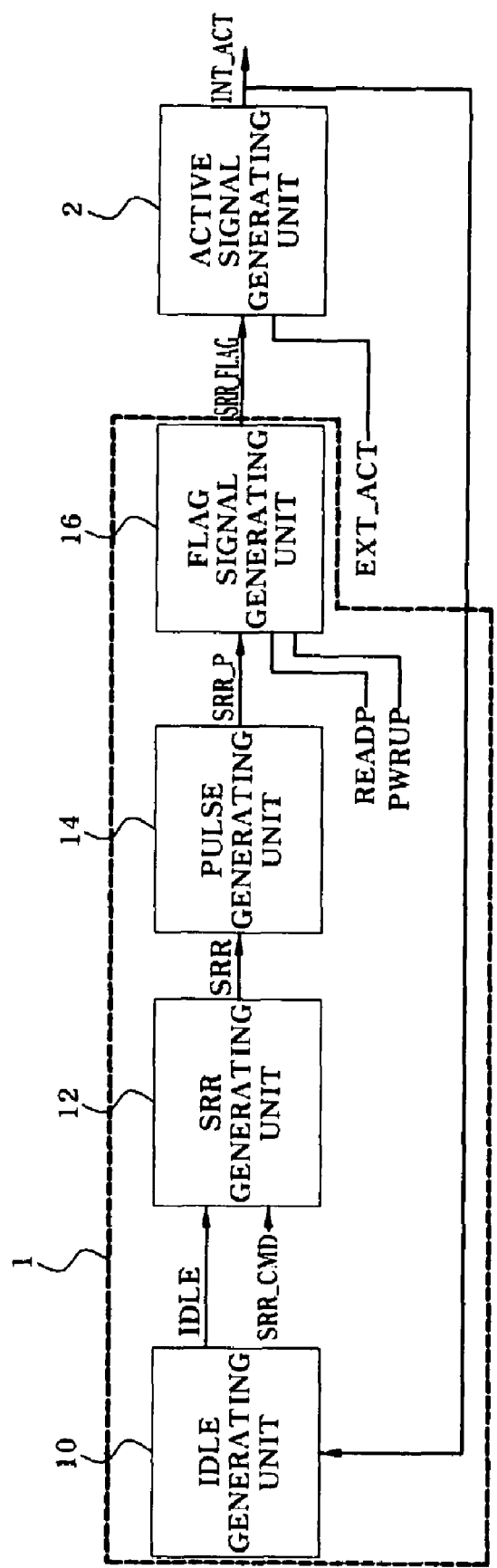
FIG. 2 is a block diagram illustrating the configuration of a semiconductor memory device according to an embodiment of the present invention.

FIG. 2 is a block diagram illustrating the configuration of a semiconductor memory device according to an embodiment of the present invention.

As illustrated in FIG. 2, the semiconductor memory device according to the embodiment of the present invention includes a flag signal generation circuit 1 and an active signal generating unit 2. The flag signal generation unit 1 includes an idle signal generating unit 10, a status register read (SRR) signal generating unit 12, a pulse signal generating unit 14 and a flag signal generating unit 16.

The idle signal generating unit 10 generates an idle signal IDLE enabled to a high level in an idle state of the semiconductor memory device. The configuration of the idle signal generating unit 10 is generally known by those skilled in the art. Therefore, its detailed description will be omitted. The idle state refers to a state that the semiconductor memory device does not perform an operation such as reading or writing.

Figure 3:
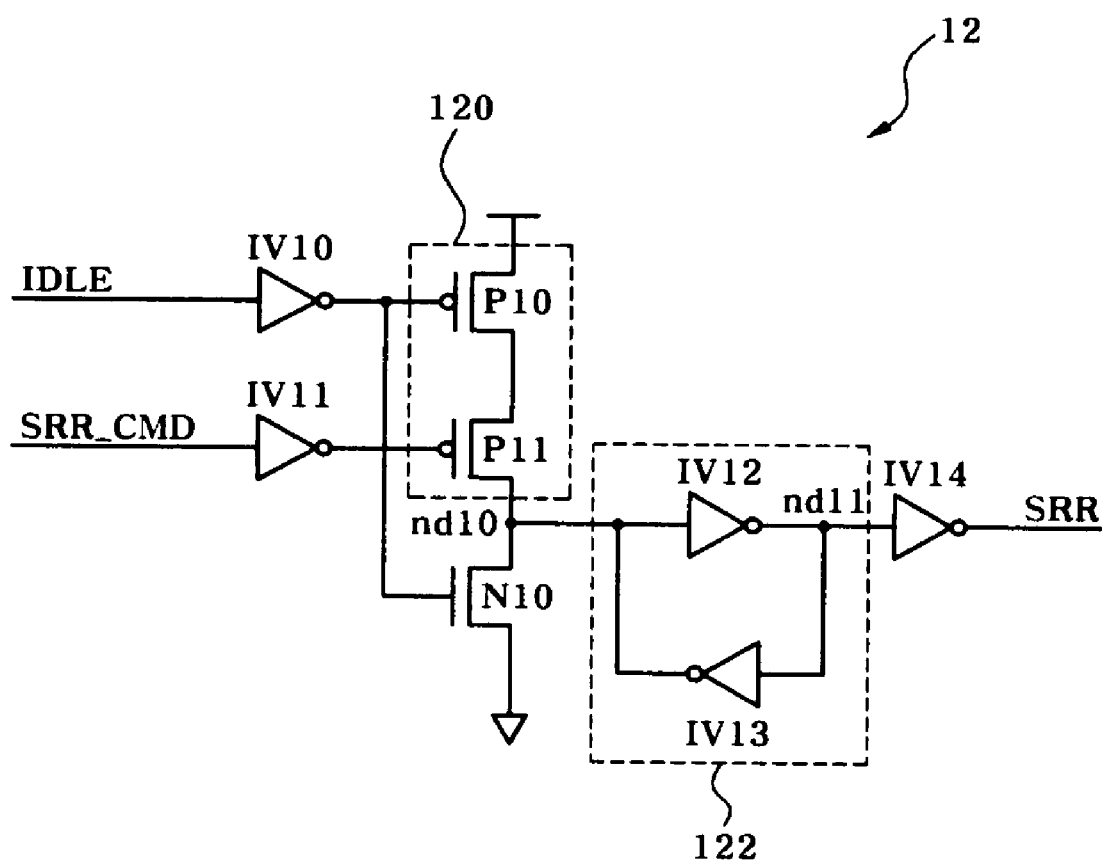
FIG. 3 is a circuit diagram of an SRR signal generating unit of the semiconductor memory device illustrated in FIG. 2.

As illustrated in FIG. 3, the SRR signal generating unit 12 includes a pull-up unit 120, an NMOS transistor N10, a latch 122 and an inverter IV14. The pull-up unit 120 pull-up drives a node nd10 in response to an inversion signal of the idle signal IDLE and an inversion signal of an SRR command SRR_CMD. The NMOS transistor N10 operates as a pull-down device that pull-down drives the node nd10 in response to the inversion signal of the idle signal IDLE. The latch 122 latches signals at the node nd10 and a node nd11. The inverter IV14 generates an SRR signal SRR by inverting an output signal of the latch 122. Here, the SRR command SRR_CMD is a signal generated in response to a mode register set (MRS) command generated by a command decoder (not shown) in accordance with JEDEC SPEC.

The SRR signal generating unit 12 configured as described above generates an SRR signal SRR enabled to a high level when the idle signal IDLE has a high level, i.e., when a high-level SRR command SRR_CMD is inputted in an idle state of the semiconductor memory device.

The pulse signal generating unit 14 receives the SRR signal SRR enabled to a high level and generates an SRR pulse signal SRR_P enabled during a predetermined period. The configuration of a circuit for generating a pulse signal in response to an enable signal is generally known by those skilled in the art. Therefore, detailed description of the pulse signal generating unit 14 will be omitted.

Figure 4:
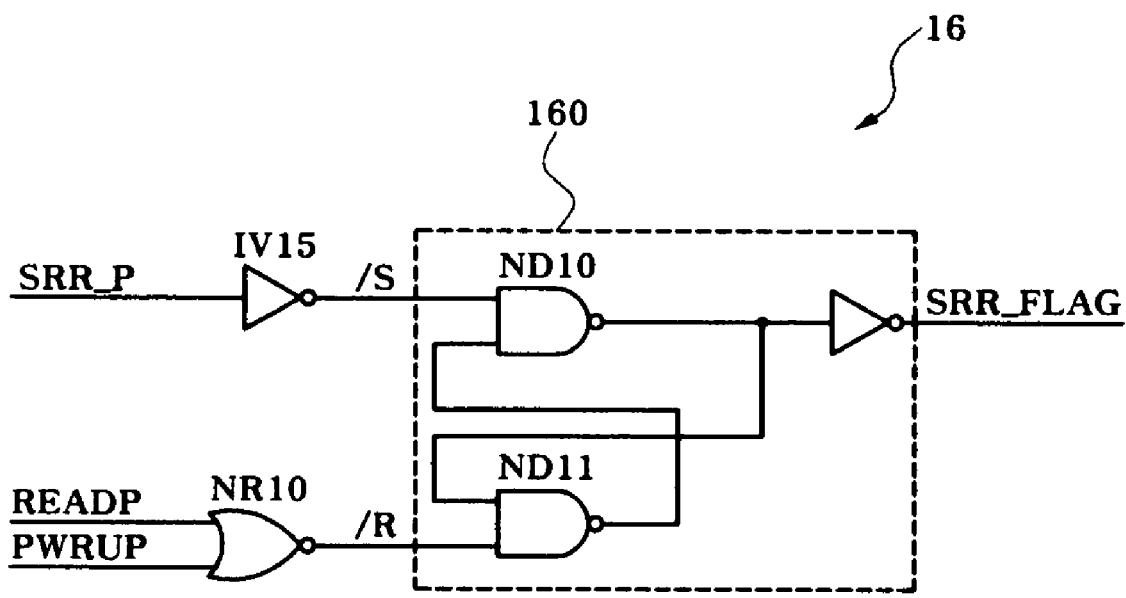
FIG. 4 is a circuit diagram of a flag signal generating unit of the semiconductor memory device illustrated in FIG. 2.

As illustrated in FIG. 4, the flag signal generating unit 16 includes a NOR gate NR10 and an SR latch unit 160. The NOR gate NR10 receives a read signal READP and a power-up signal PWRUP, and performs a NOR operation with respect to the read signal READP and the power-up signal PWRUP. The SR latch unit 160 receives an inversion signal of the SRR pulse signal SRR_P as a set signal/S and receives an output signal of the NOR gate NR10 as a reset signal/R, thereby generating an SRR flag signal SRR_FLAG. Here, the read signal READP is a signal enabled when a read command for SRR is inputted. The power-up signal PWRUP is a signal which has a high level in a power-up period and is shifted to a low level after the power-up period is ended.

In the flag signal generating unit 16 configured as described above, an output signal of a NAND gate ND11 is initialized as a high level by a high-level power-up signal PWRUP. In this state, when a high-level SRR pulse signal SRR_P is inputted, the set signal/S has a low level, and the SRR flag signal SRR_FLAG is generated as a low level. When a high-level read signal READP is inputted, the reset signal/R has a low level, and the SRR flag signal SRR_FLAG is shifted to a high level.

Figure 5:
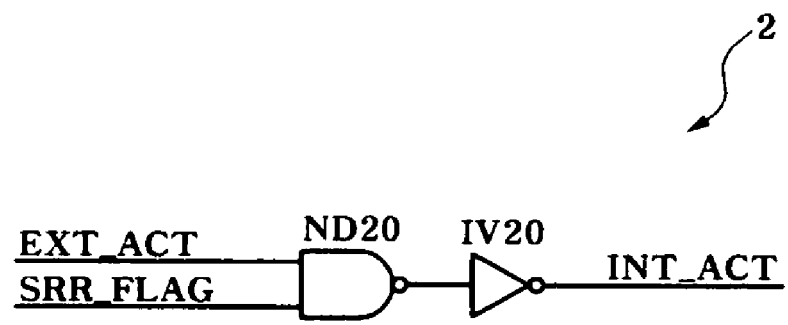
FIG. 5 is a circuit diagram of an active signal generating unit of semiconductor memory device illustrated in FIG. 2.

As illustrated in FIG. 5, the active signal generating unit 2 includes a NAND gate ND20 and an inverter IV20. The NAND gate ND20 and the inverter IV20 receive an external active command EXT_ACT for bank activation and an SRR flag signal SRR_FLAG, and perform an AND operation with respect to the external active command EXT_ACT and the SRR flag signal SRR_FLAG, thereby generating an internal active command INT_ACT. Here, the internal active command INT_ACT is enabled to a high level and activates a bank.

When a low-level SRR flag signal SRR_FLAG is inputted, the active signal generating unit 2 configured as described above disables the internal active command INT_ACT to a low level regardless of the external active command EXT_ACT. When a high-level SRR flag signal SRR_FLAG is inputted, the active signal generating unit 2 outputs the external active command EXT_ACT as the internal active command INT_ACT.

Hereinafter, the operation of the semiconductor memory device configured as described above will be described.

As SRR is started in accordance with the JEDEC SPEC, an SRR command SRR_CMD is first enabled to a high level. When the semiconductor memory device is in an idle state, an idle signal IDLE generated from the idle signal generating unit 10 has a high level.

Subsequently, the SRR signal generating unit 12 receives the SRR command SRR_CMD and the idle signal IDLE, and generates an SRR signal SRR. More specifically, the SRR command SRR_CMD and the idle signal IDLE are all inputted as a high level, the PMOS transistors P10 and P11 of the pull-up unit 120 are turned on, and the node nd10 is pull-up driven. Therefore, the SRR signal SRR is enabled to a high level.

Subsequently, the pulse signal generating unit 14 receives the SRR signal enabled to a high level and generates an SRR pulse signal SRR_P enabled during a predetermined period.

Subsequently, the flag signal generating unit 16 receives the SRR pulse signal SRR_P and generates an SRR flag signal SRR_FLAG. More specifically, an output signal of the NAND gate ND11 is initialized as a high level by a high-level power-up signal PWRUP in a power-up period. In this state, when a high-level SRR pulse signal SRR_P is inputted, a set signal/S has a low level, and the SRR flag signal SRR_FLAG is generated as a low level. Thereafter, when a read operation for SRR is performed, a read signal READP is inputted as a high level, and a reset signal/R is shifted to a low level. Therefore, the SRR flag signal SRR_FLAG is shifted to a high level.

Briefly, the SRR flag signal SRR_FLAG generated from the flag signal generation circuit 1 is enabled to a low level from the period in which the SRR pulse signal SRR_P is inputted as a high level to the period in which the read signal READP is inputted as a high level after the SRR is started. After the high-level read signal READP is inputted, the SRR flag signal SRR_FLAG is shifted to a high level.

Accordingly, since the SRR flag signal SRR_FLAG is generated as a low level before the read operation for SRR is performed, the active signal generating unit 2 disables an internal active command INT_ACT to a low level regardless of an external active command EXT_ACT. That is, before the read operation for SRR is performed, the external active command EXT_ACT for bank activation is neglected. After the read operation for SRR is performed, the SRR flag signal SRR_FLAG is generated as a high level. Therefore, the active signal generating unit 2 outputs the external active command EXT_ACT as the internal active command INT_ACT so that a normal bank active operation is performed.

As described above, in the semiconductor memory device according to the embodiment of the present invention, the external active command EXT_ACT inputted before performance of a read operation for SRR is neglected, and a normal active operation is performed when the external active command EXT_ACT is inputted after the performance the read operation for SRR. Accordingly, in the semiconductor memory device according to the embodiment of the present invention, the read operation for SRR can be performed regardless of an input of the external active command EXT_ACT, unlike in the JEDEC SPEC. Since the inputted external active command EXT_ACT is neglected, the read operation for SRR is not contradictory to the JEDEC SPEC.

While the present invention has been described with respect to the particular embodiments, it will be apparent to those skilled in the art that various changes and modifications may be made without departing from the spirit and scope of the invention as defined in the following claims.

The present disclosure claims priority to Korean application number 10-2008-0097385, filed on Oct. 2, 2008, the entire contents of which are incorporated herein by reference.

What is claimed is:

1. A flag signal generation circuit comprising:
   a status register read (SRR) signal generating unit receiving an idle signal and an SRR command to generate an SRR signal;
   a pulse signal generating unit receiving an SRR signal to generate a pulse signal; and a flag signal generating unit receiving the pulse signal and a read signal for SRR to generate a flag signal.

2. The flag signal generation circuit of claim 1, wherein the SRR signal generating unit generates the SRR signal enabled when the SRR command is inputted in an idle state of the semiconductor memory device.

3. The flag signal generation circuit of claim 2, wherein the SRR generating unit comprises:
   a pull-up unit pull-up driving a first node in response to the idle signal and the SRR command;
   a pull-down device pull-down driving the first node in response to the idle signal; and
   a latch latching signals at the first node and a second node.

4. The flag signal generation circuit of claim 1, wherein the pulse signal generating unit generates the pulse signal during a period in which the SRR signal is enabled.

5. The flag signal generation circuit of claim 1, wherein the flag signal generating unit generates the flag signal enabled from a period in which the pulse signal is inputted to a period in which the read signal is inputted.

6. The flag signal generation circuit of claim 5, wherein the flag signal generating unit comprises:
   a logic unit receiving the read signal and a power-up signal, and generating a reset signal; and
   a latch unit receiving an inversion signal of the pulse signal as a set signal and receiving the reset signal, thereby latching the set and reset signals to generate a flag signal.

7. The flag signal generation circuit of claim 6, wherein the reset signal is enabled when a read operation for SRR is performed or the power-up signal is enabled.

8. The flag signal generation circuit of claim 7, wherein the flag signal is enabled when the set signal is enabled, and disabled when the reset signal is enabled.

9. A semiconductor memory device comprising:
   a flag signal generation circuit generating a flag signal enabled until a read signal for SRR is inputted after SRR is started; and
   an active signal generating unit receiving the flag signal and an external active signal to generate an internal active signal.

10. The semiconductor memory device of claim 9, wherein the flag signal generation circuit comprises:
    an SRR signal generating unit receiving an idle signal and an SRR command to generate an SRR signal;
    a pulse signal generating unit receiving an SRR signal to generate a pulse signal; and
    a flag signal generating unit receiving the pulse signal and a read signal for SRR to generate a flag signal.

11. The semiconductor memory device of claim 10, wherein the SRR signal generating unit generates the SRR signal enabled when the SRR command is inputted in an idle state of the semiconductor memory device.

12. The semiconductor memory device of claim 11, wherein the SRR signal generating unit comprises:
    a pull-up unit pull-up driving a first node in response to the idle signal and the SRR command;
    a pull-down device pull-down driving the first node in response to the idle signal; and
    a latch latching signals at the first node and a second node.

13. The semiconductor memory device of claim 10, wherein the pulse signal generating unit generates the pulse signal during a period in which the SRR signal is enabled.

14. The semiconductor memory device of claim 10, wherein the flag signal generating unit generates the flag signal enabled from a period in which the pulse signal is inputted to a period in which the read signal is inputted.

15. The semiconductor memory device of claim 14, wherein the flag signal generating unit comprises:
    a logic unit receiving the read signal and a power-up signal, and generating a reset signal; and
    a latch unit receiving an inversion signal of the pulse signal as a set signal and receiving the reset signal, thereby latching the set and reset signals to generate a flag signal.

16. The semiconductor memory device of claim 15, wherein the reset signal is enabled when a read operation for SRR is performed or the power-up signal is enabled.

17. The semiconductor memory device of claim 16, wherein the flag signal is enabled when the set signal is enabled, and disabled when the reset signal is enabled.

18. The semiconductor memory device of claim 9, wherein the active signal generating unit outputs the external active signal as the internal active signal when the flag signal is disabled.

19. The semiconductor memory device of claim 18, wherein the active signal generating unit receives the flag signal and the external active signal, and performs an AND operation with respect to the flag signal and the external active signal, thereby generating the internal active signal.

* * * * *